(12) United States Patent
Mori et al.

(10) Patent No.: US 9,543,128 B2
(45) Date of Patent: Jan. 10, 2017

(54) SPUTTERING TARGET FOR FORMING PROTECTIVE FILM AND LAMINATED WIRING FILM

(71) Applicant: MITSUBISHI MATERIALS CORPORATION, Tokyo (JP)

(72) Inventors: Satoru Mori, Okegawa (JP); Souhei Nonaka, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/090,203

(22) Filed: Nov. 26, 2013

(65) Prior Publication Data
US 2014/0227557 A1     Aug. 14, 2014

(30) Foreign Application Priority Data
Feb. 14, 2013   (JP) ................. 2013-027046

(51) Int. Cl.
| | |
|---|---|
| *B32B 15/20* | (2006.01) |
| *H01J 37/34* | (2006.01) |
| *H05K 3/02* | (2006.01) |
| *H05K 1/09* | (2006.01) |
| *H05K 3/06* | (2006.01) |

(52) U.S. Cl.
CPC ........... *H01J 37/3426* (2013.01); *H05K 3/022* (2013.01); *H05K 1/09* (2013.01); *H05K 3/06* (2013.01); *H05K 2201/0317* (2013.01); *H05K 2201/0338* (2013.01); *Y10T 428/1291* (2015.01)

(58) Field of Classification Search
None
See application file for complete search history.

(56) References Cited

U.S. PATENT DOCUMENTS

| | | | | | |
|---|---|---|---|---|---|
| 2,430,419 | A | * | 11/1947 | Edens ................. | B23K 35/302 420/486 |
| 2,901,692 | A | * | 8/1959 | Polhemus ..................... | 324/500 |
| 3,721,535 | A | * | 3/1973 | Pryor et al. .................. | 428/675 |
| 5,422,150 | A | * | 6/1995 | Scoular ..................... | B32B 3/06 428/141 |

(Continued)

FOREIGN PATENT DOCUMENTS

| | | |
|---|---|---|
| CN | 1341157 A | 3/2002 |
| CN | 101698207 A | 4/2010 |

(Continued)

OTHER PUBLICATIONS

Office Action mailed on Apr. 26, 2016 issued for corresponding Japanese Patent Application No. 2013-027046.

(Continued)

*Primary Examiner* — Daniel J Schleis
(74) *Attorney, Agent, or Firm* — Locke Lord LLP

(57) ABSTRACT

A sputtering target for forming protective film according to the invention is used to form protective film on one surface or both surfaces of a Cu wiring film, and includes 8.0 to 11.0% by mass of Al, 3.0 to 5.0% by mass of Fe, 0.5 to 2.0% by mass of Ni and 0.5 to 2.0% by mass of Mn with a remainder of Cu and inevitable impurities. In addition, a laminated wiring film includes a Cu wiring film and protective film formed on one surface or both surfaces of the Cu wiring film, and the protective film is formed by using the above sputtering target.

1 Claim, 3 Drawing Sheets

(56) References Cited

U.S. PATENT DOCUMENTS

| | | | |
|---|---|---|---|
| 6,872,464 B2* | 3/2005 | Hubner | B23K 35/0244 228/193 |
| 7,297,419 B2* | 11/2007 | Watanabe | C22F 1/02 428/698 |
| 2005/0061857 A1* | 3/2005 | Hunt | B23K 3/047 228/245 |
| 2009/0297883 A1* | 12/2009 | Koppensteiner et al. | 428/675 |
| 2014/0227557 A1 | 8/2014 | Mori et al. | |
| 2014/0315043 A1 | 10/2014 | Mori et al. | |
| 2015/0136595 A1* | 5/2015 | Maki | C22C 9/00 204/298.13 |

FOREIGN PATENT DOCUMENTS

| | | | |
|---|---|---|---|
| CN | 102177273 A | | 9/2011 |
| CN | 102560187 A | | 7/2012 |
| CN | 103151090 A | | 6/2013 |
| DE | 650931 | * | 9/1937 |
| JP | H01-222047 A | | 9/1989 |
| JP | H01-252516 A | | 10/1989 |
| JP | H05-36401 A | | 2/1993 |
| JP | 2002-294437 A | | 10/2002 |
| JP | 2005-206861 A | | 8/2005 |
| JP | 2006-241587 A | | 9/2006 |
| JP | 2008-311283 A | | 12/2008 |
| JP | 2012-193444 A | | 10/2012 |
| JP | 2013-133489 A | | 7/2013 |
| KR | 10-2006-0037247 A | | 5/2006 |
| WO | WO-95/04368 A1 | | 2/1995 |

OTHER PUBLICATIONS

International Search Report mailed Dec. 16, 2014, issued for PCT/JP2014/077195 and English translation thereof.
Office Action dated on Mar. 22, 2016 issued for corresponding Taiwanese Patent Application No. 103135821.
Office Action dated on May 2, 2016 issued for corresponding Korean Patent Application No. 10-2016-7006552.
Office Action dated on Jun. 24, 2016 issued for corresponding U.S. Appl. No. 14/914,091.
Kadlec et al. in "Low pressure magnetron sputtering and selfsputtering discharges," in Vacuum, vol. 47, No. 3, 1996, pp. 307-311.
Office Action dated on Aug. 3, 2016 issued for corresponding Chinese Patent Application No. 201480046016.4.
Office Action dated on Nov. 4, 2016 issued for corresponding Chinese Patent Application No. 201310545415.2.

* cited by examiner

SPUTTERING TARGET FOR FORMING PROTECTIVE FILM AND LAMINATED WIRING FILM

BACKGROUND OF THE INVENTION

Field of the Invention

The present invention relates to a sputtering target for forming protective film which is used when forming protective film that protect a Cu wiring film including copper or a copper alloy, and a laminated wiring film including a protective film formed by using the sputtering target for forming protective film.

The present application claims the right of priority to Japanese Patent Application No. 2013-027046 filed on Feb. 14, 2013 in Japan, and the contents thereof are incorporated herein by reference.

Description of Related Art

In the past, Al was widely used in wiring film for flat panel displays such as liquid crystal or organic EL, panels or touch panels. In recent years, an attempt has been made to reduce the size (width) and thickness of wiring film, and there has been a demand for wiring film with a lower resistivity than those in the past.

As the size and thickness of wiring film are reduced, wiring film for which copper or a copper alloy that is a material with a lower resistivity than Al is used are provided.

However, there was a problem in that Cu wiring film including copper or a copper alloy with a low resistivity were easily discolored in a humid atmosphere. In a case in which a copper alloy containing a large amount of additional elements to improve weather resistance is used, the resistivity increases.

Therefore, for example, Japanese Unexamined Patent Application, First Publication No. 2012-193444 proposes a laminated film having a protective film including a Ni—Cu—(Cr, Ti) alloy formed on a Cu wiring film and a sputtering target for forming the protective film. Since the protective film has superior weather resistance to copper, it becomes possible to suppress discoloration of the surface even when the laminated film is stored in the atmosphere.

SUMMARY OF THE INVENTION

In a case in which a Cu wiring film including copper or a copper alloy is patterned through etching, an etchant containing iron chloride is used. In a case in which the laminated film having a protective film including a Ni—Cu—(Cr, Ti) alloy was etched by using the etchant containing iron chloride, there were cases in which some of the protective film did not melt and remained as residue. Since there was a concern that the residue might short-circuit wires, it was difficult to use the laminated film as a wiring film.

In addition, in a case in which the laminated film contained Cr, a liquid waste after etching also contained Cr, and thus there was a problem in that a sizeable cost was required to treat the liquid waste.

Furthermore, since the laminated film contained a large amount (35 to 84.5% by mass) of relatively expensive Ni, there was a problem in that the manufacturing cost of a sputtering target and a laminated film increased.

In addition, when the laminated film on the substrate was etched, there were cases in which the shape of the cross-section of etched wires became a rectangular shape or a reverse tapered shape that tapered toward the substrate side. In a case in which the shape of the cross-section of the etched wires became a rectangular shape or a reverse tapered shape, there was a concern that defects called voids might be generated in the edge portion of the Cu wiring film, the wires might be cut while stacking layers and the yield and the quality might be degraded.

The present invention has been made in consideration of the above circumstances, and an object of the present invention is to provide a sputtering target for forming protective film which can form a protective film that is excellent in terms of weather resistance, can suppress the discoloration of the surface, has favorable etchability, has a laminated film formed on a substrate obtaining a tapered cross-sectional shape that widens toward the substrate side after being etched, and can suppress generation of voids; and a laminated wiring film having a protective film formed by using the sputtering target for forming protective film.

(1) A sputtering target for forming protective film according to an aspect of the invention is used to form protective film on one surface or both surfaces of a Cu wiring film, and includes 8.0 to 11.0% by mass of Al, 3.0 to 5.0% by mass of Fe, 0.5 to 2.0% by mass of Ni and 0.5 to 2.0% by mass of Mn with a remainder of Cu and inevitable impurities.

Since the sputtering target for forming protective film of the present invention in the above configuration includes a Cu-based alloy including 8.0 to 11.0% by mass of Al, 3.0 to 5.0% by mass of Fe, 0.5 to 2.0% by mass of and 0.5 to 2.0% by mass of Mn with a remainder of Cu and inevitable impurities, a formed protective film is etched to the same extent as a Cu wiring film even when being etched by using an etchant containing iron chloride, and it becomes possible to suppress generation of non-molten residue. Furthermore, it becomes possible to provide a tapered cross-sectional shape of etched wires.

In addition, since the content of Ni is as small as 0.5 to 2.0% by mass the manufacturing cost of the sputtering target and the protective film can be significantly reduced.

(2) According to another aspect of the present invention, a laminated wiring film includes a Cu wiring film and protective film formed on one surface or both surfaces of the Cu wiring film, and the protective film are formed by using the sputtering target for forming protective film according to (1).

Since the laminated wiring film of the present invention in the above configuration has protective film formed by using the sputtering target for forming, protective film with the above composition, the weather resistance improves, and discoloration can be suppressed even when the laminated wiring film is stored in the atmosphere.

In addition, since the protective film includes a Cu-based alloy, it becomes possible to suppress generation of non-molten residue even when etching the protective film by using an etchant containing iron chloride. In addition, it is possible to provide tapered cross-sectional shape of etched wires, and it becomes possible to suppress generation of voids.

Furthermore, since the laminated wiring film does not contain Cr, a liquid waste after etching can be treated at a low cost. Furthermore, since the content of Ni is as small as 0.5 to 2.0% by mass, the manufacturing cost of the sputtering target and the laminated wiring film can be significantly reduced.

As described above, according to the present invention, it is possible to provide a sputtering target for forming protective film which can form a protective film that is excellent in terms of weather resistance, can suppress discoloration of the surface, has favorable etchability, obtains a tapered cross-sectional shape after being etched, and can suppress generation of voids; and a laminated wiring film having a protective film formed by using the sputtering target for forming protective film.

DETAILED DESCRIPTION OF THE INVENTION

Figure 1:
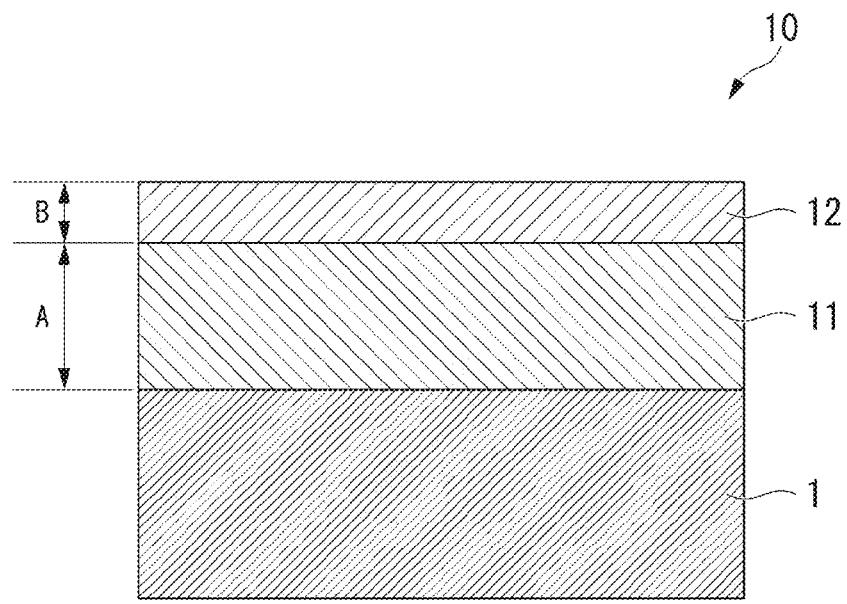
FIG. 1 is an explanatory view of a cross-section of a laminated wiring film that is an embodiment of the present invention.

Hereinafter, a sputtering target for forming protective film and a laminated wiring film of embodiments of the present invention will be described.

The sputtering target for forming protective film of the present embodiment is used to form a protective film on a Cu wiring film including copper or a copper alloy.

The sputtering target for forming protective film has a composition including 8.0 to 11.0% by mass of 3.0 to 5.0% by mass of Fe, 0.5 to 2.0% by mass of Ni and 0.5 to 2.0% by mass of Mn with a remainder of Cu and inevitable impurities.

The sputtering target for forming protective film is manufactured by carrying out steps of casting, hot rolling, thermal treatment and mechanical work.

Hereinafter, the reasons for specifying the composition of the sputtering target for forming protective film of the present embodiment as described above will be described.

(Al: 8.0 to 11.0% by Mass)

Al is an element having an effect that improves the corrosion resistance of sputtered film. The containment of Al enables the improvement of the corrosion resistance of sputtered film.

Here, in a case in which the content of Al is less than 8.0% by mass, the corrosion resistance of sputtered film does not sufficiently improve, and there is as concern that discoloration may occur in a temperature and humidity controlled test. On the other hand, in a case in which the content of Al exceeds 11.0% by mass, since hot workability degrades, there is a concern that cracking may occur during hot working when manufacturing sputtering targets.

For the above reasons, the content of Al is set to be in a range of 8.0 to 11.0% by mass.

(Fe: 3.0 to 5.0% by Mass)

Fe has an effect that makes etched wires have a tapered cross-sectional shape. Here, in a case in which the content of Fe is less than 3.0% by mass, the effect that makes wires have a tapered cross-sectional shape does not sufficiently improve, the cross-sectional shape of etched wires becomes a reverse-tapered shape or a rectangular shape, and there is a concern that voids may be generated. On the other hand, in a case in which the content of Fe exceeds 5.0% by mass, the corrosion resistance of sputtered film is adversely influenced, and there is a concern that discoloration may occur in a temperature and humidity controlled test.

For the above reasons, the content of Fe is set to be in a range of 3.0% by mass to 5.0% by mass.

(Ni: 0.5% to 2.0% by Mass)

Ni is an element having an effect that improves the hot workability of ingots. The containment of Ni enables suppression of the occurrence of cracking during hot working when manufacturing sputtering targets.

Here, in a case in which the content of Ni is less than 0.5% by mass, the hot workability does not sufficiently improve, and there is a concern that it may be impossible to sufficiently suppress cracking during hot working. On the other hand, in a case in which the content of Ni exceeds 2.0% by mass, an additional improvement of the effect that improves hot workability cannot be expected. Furthermore, an increase in the content of expensive Ni leads to an increase in the manufacturing cost.

For the above reasons, the content of Ni is set to be in a range of 0.5 to 2.0% by mass.

(Mn: 0.5% to 2% by Mass)

Mn is an element having an effect that improves the fluidity and hot workability of molten metal. The addition of Mn suppresses generation of casting defects and enables suppression of the occurrence of cracking during hot working when manufacturing sputtering targets.

Here, in a case in which the content of Mn is less than 0.5% by mass, there is a concern that it may be impossible to improve the fluidity and hot workability of molten metal. Or the other hand, in a case in which the content of Mn exceeds 2% by mass, an additional improvement of the effect that improves hot workability cannot be expected.

For the above reasons, the content of Mn is set to be in a range of 0.5 to 2% by mass.

Next, a laminated wiring film 10 of the present embodiment will be described.

The laminated wiring film 10 of the present embodiment includes a Cu wiring film 11 formed on a substrate 1 and a protective film 12 formed on the Cu wiring film 11 as illustrated in FIG. 1.

Here, the substrate 1 is not particularly limited, and a substrate made of glass, a resin film or the like that allows the penetration of light is used in flat panel displays, touch panels and the like.

The Cu wiring film 11 includes copper or a copper alloy, and the resistivity of the Cu wiring film is preferably set to 4.0 µΩcm or less (at a temperature of 25° C.). In the present embodiment, the Cu wiring film 11 includes oxygen-free copper with a purity of 99.99% by mass or more, and the resistivity is set to 3.5 µΩcm or less (at a temperature of 25° C.). In addition, the Cu wiring film 11 is formed by using a sputtering target including oxygen-free copper with a purity of 99.99% by mass or more.

In addition, the thickness A of the Cu wiring film 11 is preferably set to be in a range of 50 nm≤A≤800 nm, and more preferably set to be in a range of 100 nm≤A≤300 nm.

The protective film 12 is formed by using the sputtering target for forming protective film of the present embodiment, and has the same composition as that of the sputtering target for forming protective film.

The thickness B of the protective film 12 is preferably set to be in a range of 5 nm≤B≤100 nm, and more preferably set to be in a range of 10 nm≤B≤50 nm.

In addition, the ratio B/A in which B is the thickness of the protective film 12 and A is the thickness of the Cu wiring film 11 is preferably in a range of 0.02<B/A<1.0, and more preferably set to be in a range of 0.1<B/A<0.3.

The sputtering target for forming protective film and the laminated wiring film 10 of the present embodiments in the above configurations have a composition including 8.0 to 11.0% by mass of Al, 3.0 to 5.0% by mass of Fe, 0.5 to 2.0% by mass of Ni and 0.5 to 7.0% by mass of Mn with a remainder of Cu and inevitable impurities, and includes a Cu-based alloy as described above, and therefore the sputtering target for forming protective film and the laminated wiring film can be favorably etched even when etched by using an etchant containing iron chloride, and it becomes possible to suppress generation of non-molten residue.

In addition, since the sputtering target for forming protective film and the protective film 12 contain Al in the above range, the weather resistance improves, and the discoloration of the surface of the laminated wiring film 10 can be reliably suppressed.

Furthermore, since the sputtering target for forming protective film and the protective film 12 do not contain Cr, a liquid waste after etching can be treated at a low cost.

In addition, since the sputtering target for forming protective film and the protective film contain Fe in the above range, the cross-sectional shape of wires obtained through etching becomes a tapered shape, and generation of voids can be suppressed.

Furthermore, since the content of Ni is as small as 0.5 to 2.0% by mass, the manufacturing cost of the sputtering target for forming protective film and the laminated wiring film 10 can be significantly reduced.

Furthermore, since the sputtering target for forming protective film and the protective film respectively contain Ni and Mn in the above ranges, hot workability is excellent, and the sputtering target for forming protective film of the present embodiment can be favorably manufactured.

In addition, in the present embodiment, the Cu wiring film 11 includes copper or a copper alloy, and the resistivity is set to 4.0 μΩcm or less at a temperature of 25° C.), more specifically, the Cu wiring film includes oxygen-free copper with a resistivity of 3.5 μΩcm or less (at a temperature of 25° C.), and the thickness A of the Cu wiring film 11 is set to be in a range of 50 nm≤A≤800 nm, electric conduction can be favorably carried out by using the Cu wiring film 11.

Furthermore, in the present embodiment, since the thickness B of the protective film 12 is set to be in a range of 5 nm≤B≤100 nm, and the ratio B/A in which B is the thickness of the protective film 12 and A is the thickness of the Cu wiring film 11 is set to be in a range of 0.02<B/A<1.0, the discoloration of the Cu wiring film 11 can be reliably suppressed, and favorable etchability can be ensured.

Hitherto, the embodiments of the present invention have been described, the present invention is not limited thereto, and the present invention can be appropriately modified within the scope of the technical concept of the present invention.

For example, in the present embodiment, a structure in which the laminated wiring film is formed on the substrate has been described as an example, but the structure is not limited thereto, and it is also possible to form a transparent conductive film, such as an ITO film or an AZO film, on a substrate and form a laminated wiring film on the transparent conductive film.

In addition, the Cu wiring film has been described to be included oxygen-free copper with a purity of 99.99% by mass or more, but the material is not limited thereto, and the Cu wiring film may include, for example, pure copper such as tough-pitch copper or a copper alloy containing a small amount of additional elements.

EXAMPLES

Hereinafter, the effects of the sputtering target for forming protective film and the laminated wiring film according to the present invention will be evaluated, and the results of evaluation tests will be described.

<Pure Copper Target for Forming Cu Wiring Film>

An ingot of oxygen-free copper with a purity of 99.99% by mass was prepared, and hot rolling at 800° C., steel relief annealing and mechanical work were carried out on the ingot, thereby producing pure copper target for forming Cu wiring film with dimensions of an outer diameter of 100 mm and a thickness of 5 mm.

Next, an oxygen-free copper backing plate was prepared, the pure copper target for forming Cu wiring film was laid on the oxygen-free copper backing plate, and soldered by using indium at a temperature of 200° C., thereby producing a backing plate-attached target.

<Sputtering Target for Forming Protective Film>

Oxygen-free copper (purity: 99.99% by mass), aluminum (purity: 99.99% by mass), commercial pure iron (purity: 99% by mass), low carbon nickel (purity: 99.9% by mass) and electrolytic manganese metal (purity: 99.9% by mass) were prepared as raw materials to be melted, the raw materials to be melted were melted by using high frequency in a high-purity graphite crucible, the components were adjusted to molten metal having a composition described in Table 1, and then cast into a cooled carbon casting mold, thereby obtaining an ingot with a size of 50 mm×50 mm×30 mm.

Next, hot rolling was carried out on the ingot with a rolling reduction of approximately 10% at 800° C. until a thickness of 10 mm, oxides or marks on the surface were removed through facing, and then steel relief annealing was carried out. The surfaces of an obtained rolled sheet were mechanically worked, and sputtering targets for forming protective film of Invention Examples 1 to 23 and Comparative Examples 1 to 6 with dimensions of an outer diameter of 100 mm and a thickness of 5 mm were produced. Furthermore, a sputtering target including Ni: 64.0% by mass and Ti: 4.0% by mass with a remainder of Cu and inevitable impurities was prepared as Conventional Example 1.

Next, an oxygen-free copper backing plate was prepared, the obtained sputtering target for forming protective film was laid on the oxygen-free copper backing plate, and soldered by using indium at a temperature of 200° C., thereby producing a hacking plate-attached target.

Here the presence of cracking occurred during the hot rolling was checked in the sputtering targets for forming protective film of Invention Examples 1 to 23 and Comparative Examples 1 to 6. The results are described in Table 1.

<Laminated Wiring Film>

The pure copper target for forming Cu wiring film was set in a sputtering apparatus so that the distance from a glass substrate (1737 glass substrate with dimensions of a height: 20 mm, a width: 20 mm and a thickness: 0.7 mm manufactured by Corning Incorporated) became 70 mm, and sputtering was carried out under conditions of a power supply: direct-current mode, a sputter power: 150 W; a peak degree of vacuum: $5 \times 10^{-5}$ Pa; an atmosphere gas composition: pure Ar; a sputtering gas pressure: 0.67 Pa; and substrate heating: none, thereby forming a 150 nm-thick Cu wiring film on the surface of the glass substrate.

Subsequently, sputtering was carried out by using the sputtering target for forming protective film described in Table 1 under the same conditions, and a 30 nm-thick protective film was formed on the Cu wiring film. As a result, laminated wiring films of Invention Examples 101 to 123 and Comparative Examples 101 to 106, which are described in Table 2, were formed.

In addition, a laminated wiring film having a protective film formed on the Cu wiring film by using the sputtering target of Conventional Example 1 was produced as Conventional Example 101.

<Adhesiveness>

Nicks were formed in a grid shape on the laminated wiring film at intervals of 1 mm according to JIS-K 5400, peeled off by using scotch tape manufactured by 3M Company, and a cross-cut adhesion test, which measures the area % of the laminated wiring film attached to a glass substrate in a 10 mm×10 mm box in the central portion of the glass substrate, was carried out. Cases in which the area % of the laminated wiring film that remained attached even after peeling off the nicks by using scotch tape manufactured by 3M Company was 99% or more were evaluated to be "OK", and cases in which the area % was less than 99% were evaluated to be "NG". The evaluation results are described in Table 2.

<Weather Resistance>

A temperature and humidity controlled test (exposed for 250 hours at 60° C. and a relative humidity of 90%) was carried out, and the presence of change in color on the surface of the laminated wiring film was visually checked. Laminated wiring films in which discoloration was observed were evaluated to be "NO" and laminated wiring films in which discoloration could not be observed were evaluated to be "OK". The evaluation results are described in Table 2.

<Etching Residue and the Cross-Sectional Shape of Wires>

A photoresist fluid (OFPR-8600LB manufactured by Tokyo Ohka Kogyo Co., Ltd.) was applied, exposed to light and developed on the laminated wiring film formed on the glass substrate, thereby forming a resist film in a 30 μm line and space pattern. The resist film was immersed in a 4% $FeCl_3$ aqueous solution held at a solution temperature of 30° C.±1° C. so as to etch the laminated wiring film, thereby forming wires.

Figure 2:
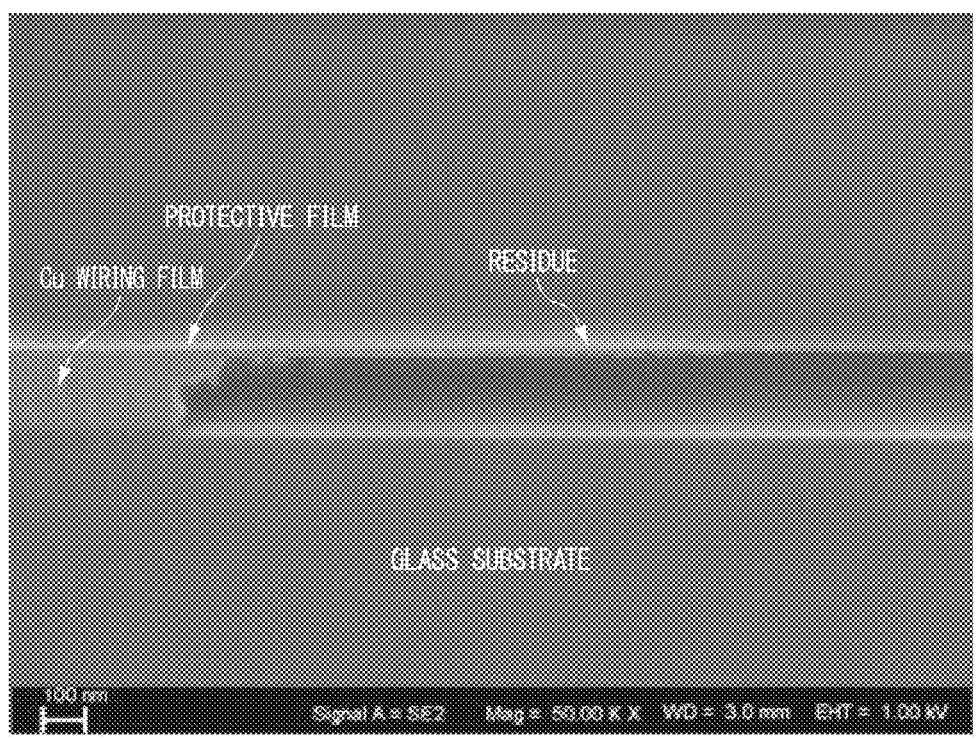
FIG. 2 is a photograph illustrating the observation result of an etched cross-section of a laminated wiring film of Conventional Example 101.
Figure 3:
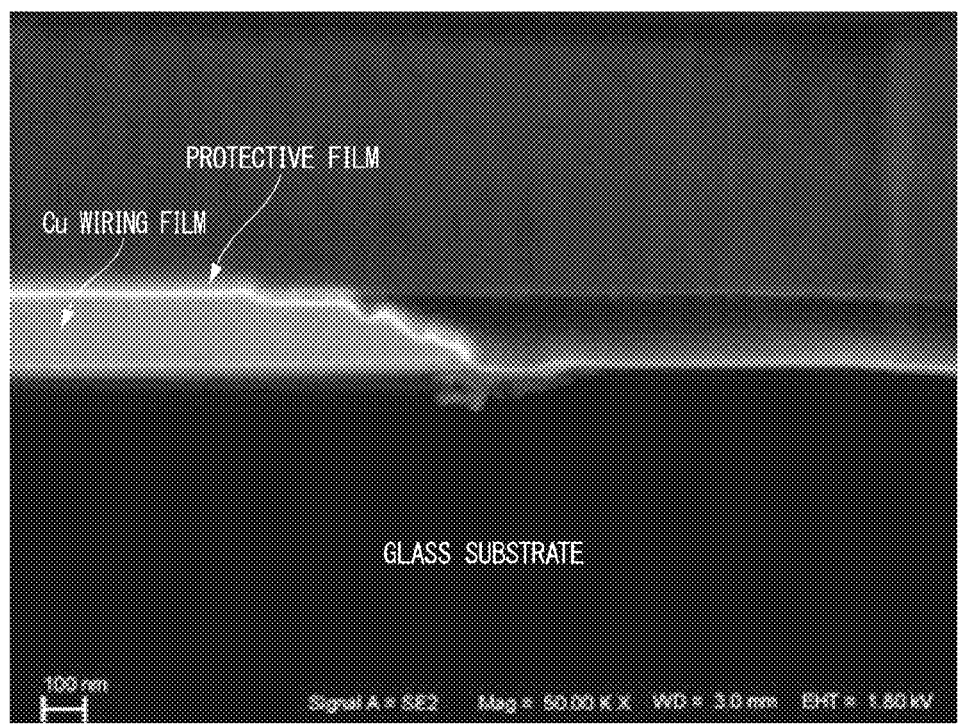
FIG. 3 is a photograph illustrating the observation result of an etched cross-section of a laminated wiring film of Invention Example 101.

Ion etching was carried out to the cross-section of the wires by irradiating Ar ion beams vertically to a specimen exposed from a masking plate, the etched cross-section of the wires was observed by using a secondary electron microscope, and the presence of etching residue and the cross-sectional shape of the wires were investigated by observing a cross-section of the wires. FIGS. 2 and 3 illustrate the etched cross-sections of laminated wiring film in which a glass substrate, a Cu wiring film, a protective film and a resist were stacked. FIG. 2 is an observation result of an etched cross-section of Conventional Example 101, and FIG. 3 is an observation result of an etched cross-section of Invention Example 101. Here, FIG. 2 illustrates an example in which residue is observed, and voids are formed between the glass substrate and the residue through etching. Etched cross-sections including the residue were evaluated to be YES, and etched cross-sections having no residue observed were evaluated to be NO. In addition, the cross-sectional shapes of the wires were evaluated to be a tapered shape or a reverse tapered shape. The evaluation results are described in Table 2.

<Etching Rate>

Sputtering was carried out in the same conditions as described above by using the sputtering target for forming protective film, and a 150 nm-thick protective film was formed on the glass substrate. The glass substrate on which only the protective film single layer was formed was immersed in a 4% $FeCl_3$ aqueous solution held at a solution temperature of 30° C.±1° C. so as to etch the protective film, and a necessary time to remove the protective film in visual observation was measured, thereby obtaining an etching rate. The evaluation results are described in Table 2.

TABLE 1

| | | Component composition (% by mass) | | | | | Cracking during |
| --- | --- | --- | --- | --- | --- | --- | --- |
| | | Al | Fe | Ni | Mn | Others | Cu | hot rolling |
| Invention Example | 1 | 9.6 | 3.9 | 1.3 | 1.3 | — | Remainder | No |
| | 2 | 8.1 | 3.5 | 0.8 | 1.5 | — | Remainder | No |
| | 3 | 10.9 | 3.9 | 1.1 | 0.6 | — | Remainder | No |
| | 4 | 8.5 | 3.0 | 0.6 | 1.2 | — | Remainder | No |
| | 5 | 10.5 | 4.9 | 1.8 | 0.8 | — | Remainder | No |
| | 6 | 8.6 | 4.0 | 0.5 | 1.1 | — | Remainder | No |
| | 7 | 10.1 | 4.1 | 1.9 | 1.3 | — | Remainder | No |
| | 8 | 9.0 | 3.8 | 0.9 | 0.5 | — | Remainder | No |
| | 9 | 10.0 | 4.2 | 1.3 | 1.9 | — | Remainder | No |
| | 10 | 8.0 | 3.0 | 1.0 | 0.7 | — | Remainder | No |
| | 11 | 10.9 | 5.0 | 1.3 | 1.7 | — | Remainder | No |
| | 12 | 8.1 | 4.1 | 0.5 | 1.3 | — | Remainder | No |
| | 13 | 11.0 | 3.9 | 2.0 | 1.1 | — | Remainder | No |
| | 14 | 8.1 | 4.0 | 1.3 | 0.6 | — | Remainder | No |
| | 15 | 10.9 | 4.1 | 1.4 | 1.9 | — | Remainder | No |
| | 16 | 10.3 | 3.1 | 0.6 | 1.3 | — | Remainder | No |
| | 17 | 8.9 | 4.9 | 1.9 | 1.4 | — | Remainder | No |
| | 18 | 9.8 | 3.0 | 0.5 | 0.5 | — | Remainder | No |
| | 19 | 9.7 | 4.8 | 2.0 | 2.0 | — | Remainder | No |
| | 20 | 8.0 | 3.1 | 0.6 | 0.5 | — | Remainder | No |
| | 21 | 11.0 | 4.9 | 1.9 | 1.9 | — | Remainder | No |
| | 22 | 8.0 | 3.0 | 0.5 | 0.5 | — | Remainder | No |
| | 23 | 10.9 | 4.9 | 2.0 | 2.0 | — | Remainder | No |
| Comparative Example | 1 | 7.5 | 3.9 | 1.3 | 1.2 | — | Remainder | No |
| | 2 | 11.7 | 3.9 | 1.2 | 1.1 | — | Remainder | Yes |
| | 3 | 8.1 | 2.4 | 1.1 | 1.0 | — | Remainder | No |
| | 4 | 10.1 | 5.7 | 1.2 | 1.3 | — | Remainder | No |
| | 5 | 9.7 | 3.1 | 0.4 | 0.6 | — | Remainder | Yes |
| | 6 | 10.1 | 3.9 | 0.7 | 0.4 | — | Remainder | Yes |
| Conventional Example 1 | | — | — | 64 | — | Ti:4.0 | Remainder | — |

TABLE 2

| | | Sputtering target for forming protective film | Adhesiveness | Weather resistance | Etching residue | Cross-sectional shape of wires | Etching rate (mm/s) |
|---|---|---|---|---|---|---|---|
| Invention Example | 101 | Invention Example 1 | OK | OK | No | Tapered | 7.4 |
| | 102 | Invention Example 2 | OK | OK | No | Tapered | 7.5 |
| | 103 | Invention Example 3 | OK | OK | No | Tapered | 7.7 |
| | 104 | Invention Example 4 | OK | OK | No | Tapered | 8.2 |
| | 105 | Invention Example 5 | OK | OK | No | Tapered | 8.3 |
| | 106 | Invention Example 6 | OK | OK | No | Tapered | 7.1 |
| | 107 | Invention Example 7 | OK | OK | No | Tapered | 7.6 |
| | 108 | Invention Example 8 | OK | OK | No | Tapered | 8.7 |
| | 109 | Invention Example 9 | OK | OK | No | Tapered | 8.8 |
| | 110 | Invention Example 10 | OK | OK | No | Tapered | 7.9 |
| | 111 | Invention Example 11 | OK | NG | No | Tapered | 7.5 |
| | 112 | Invention Example 12 | OK | OK | No | Tapered | 8.2 |
| | 113 | Invention Example 13 | OK | NG | No | Tapered | 8.1 |
| | 114 | Invention Example 14 | OK | OK | No | Tapered | 8.3 |
| | 115 | Invention Example 15 | OK | NG | No | Tapered | 7.4 |
| | 116 | Invention Example 16 | OK | OK | No | Tapered | 7.1 |
| | 117 | Invention Example 17 | OK | OK | No | Tapered | 7.7 |
| | 118 | Invention Example 18 | OK | OK | No | Tapered | 8.8 |
| | 119 | Invention Example 19 | OK | OK | No | Tapered | 8.4 |
| | 120 | Invention Example 20 | OK | OK | No | Tapered | 8.7 |
| | 121 | Invention Example 21 | OK | OK | No | Tapered | 8.0 |
| | 122 | Invention Example 22 | OK | OK | No | Tapered | 7.9 |
| | 123 | Invention Example 23 | OK | OK | No | Tapered | 7.2 |
| Comparative Example | 101 | Conventional Example 1 | OK | NG | No | Tapered | 7.2 |
| | 102 | Conventional Example 2 | — | — | — | — | — |
| | 103 | Conventional Example 3 | OK | OK | No | Reverse Tapered | 8.6 |
| | 104 | Conventional Example 4 | OK | NG | No | Tapered | 8.5 |
| | 105 | Conventional Example 5 | — | — | — | — | — |
| | 106 | Conventional Example 6 | — | — | — | — | — |
| Conventional Example 101 | | Conventional Example 1 | OK | OK | Yes | Reverse Tapered | 3.6 |

In Comparative Example 101 in which the sputtering target of Comparative Example 1 which had a content of Al below the range of the present invention was used, the weather resistance was not sufficient.

In the sputtering target of Comparative Example 2 which had a content of Al above the range of the present invention, cracking occurred during hot working when manufacturing the sputtering target.

In Comparative Example 103 in which the sputtering target of Comparative Example 3 which had a content of Fe below the range of the present invention was used, the cross-sectional shape of the etched wires became a reverse tapered shape.

In Comparative Example 104 in which the sputtering target of Comparative Example 4 which had a content of Fe above the range of the present invention was used the weather resistance was not sufficient.

In the sputtering target of Comparative Example 5 which had a content of Ni below the range of the present invention, cracking occurred during hot working when manufacturing the sputtering target.

In the sputtering target of Comparative Example 6 which had a content of Mn below the range of the present invention, cracking occurred during hot working when manufacturing the sputtering target.

In addition, in Conventional Examples 1 and 101 including Ni—Ti—Cu, the etching residues were observed. In addition, the etching rates were also slow. It was confirmed that the etchability was poor. In addition, the cross-sectional shapes of the etched wires became a reverse tapered shape.

In contrast to what has been described above, in Invention Examples 1 to 23 and Invention Examples 101 to 123, the hot rolling property, the adhesiveness and the weather resistance were favorable. In addition, there was no etching residue, and the etching rates were also sufficiently fast. Furthermore, the cross-sectional shapes of the etched wires became a tapered shape.

Based on what has been described above, it was confirmed that, according to Invention Examples, it is possible to provide a sputtering target for forming protective film which can form a protective film that is excellent in terms of weather resistance, can suppress the discoloration of the surface, has favorable etchability, has a tapered cross-sectional shape after being etched, and can suppress generation of voids, and a laminated wiring film having a protective film formed by using the sputtering target for forming protective film.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention. Accordingly, the present invention is not to be considered as being limited by the foregoing description, and is only limited by the scope of the appended claims.

What is claimed is:

1. A backing plate-attached target for forming protective film on one surface or both surfaces of a Cu wiring film,
the backing plate-attached target comprising a backing plate and a sputtering target that is soldered by using indium on the backing plate,
the sputtering target consisting of:
8.0% by mass to 11.0% by mass of Al;
3.0% by mass to 5.0% by mass of Fe;
0.5% by mass to 2.0% by mass of Ni; and
0.5% by mass to 2.0% by mass of Mn
with a remainder of Cu and inevitable impurities.

* * * * *